United States Patent
Tanaka

(10) Patent No.: US 9,773,686 B2
(45) Date of Patent: Sep. 26, 2017

(54) SUBSTRATE CLEANING APPARATUS AND SUBSTRATE PROCESSING APPARATUS

(71) Applicant: EBARA CORPORATION, Tokyo (JP)

(72) Inventor: Hideaki Tanaka, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 14/501,733

(22) Filed: Sep. 30, 2014

(65) Prior Publication Data

US 2015/0099433 A1 Apr. 9, 2015

(30) Foreign Application Priority Data

Oct. 3, 2013 (JP) .................................. 2013-208020

(51) Int. Cl.
*H01L 21/67* (2006.01)
*H01L 21/687* (2006.01)
*B08B 1/04* (2006.01)

(52) U.S. Cl.
CPC .......... *H01L 21/67046* (2013.01); *B08B 1/04* (2013.01); *H01L 21/67051* (2013.01); *H01L 21/68728* (2013.01)

(58) Field of Classification Search
CPC ... H01L 21/67046; B08B 1/04; B24B 53/017; B24B 53/14
USPC ............................................. 451/73; 15/88.3
See application file for complete search history.

(56) References Cited

U.S. PATENT DOCUMENTS

| | | | | |
|---|---|---|---|---|
| 6,059,888 A * | 5/2000 | Hillman | ............ | H01L 21/67046 134/6 |
| 6,221,774 B1 * | 4/2001 | Malik | ................... | B24B 37/105 216/89 |
| 6,427,566 B1 * | 8/2002 | Jones | ................ | H01L 21/67046 15/88.3 |
| 6,546,941 B1 * | 4/2003 | Nishihara | ................. | B08B 1/04 134/157 |
| 6,595,831 B1 * | 7/2003 | Hirokawa | ................. | B08B 1/04 451/36 |
| RE38,228 E * | 8/2003 | Hirose | ................. | B24B 53/017 451/56 |
| 8,356,376 B2 * | 1/2013 | Mouri | .................... | A46B 9/005 134/6 |

(Continued)

FOREIGN PATENT DOCUMENTS

JP H09-69502 A 3/1997
JP 2006-263903 A 10/2006

(Continued)

OTHER PUBLICATIONS

English Translation of Office Action for Patent Application No. JP 2013-208020 dated Jun. 27, 2017.

*Primary Examiner* — Larry E Waggle, Jr.
*Assistant Examiner* — Henry Hong
(74) *Attorney, Agent, or Firm* — Pearne & Gordon LLP

(57) ABSTRACT

A substrate cleaning apparatus for reducing a limitation of a layout of a chemical liquid nozzle and a rinsing liquid nozzle, while enabling a load cell to be installed at an optimal location and achieving a larger adjustment range, is disclosed. The substrate cleaning apparatus includes a roll assembly including at least a roll cleaning member to be brought into contact with a substrate and a roll arm that rotatably supports the roll cleaning member, a support arm for supporting the roll assembly; an adjustment screw extending through the support arm and screwed into the roll assembly; and a screw support that fixes a relative position of the adjustment screw in a vertical direction with respect to the support arm and rotatably supports the adjustment screw.

11 Claims, 10 Drawing Sheets

(56) References Cited

U.S. PATENT DOCUMENTS

| | | | |
|---|---|---|---|
| 2001/0035535 A1* | 11/2001 | Hayashi | H01L 21/681 257/200 |
| 2002/0029431 A1* | 3/2002 | Oikawa | B08B 1/04 15/77 |
| 2002/0073495 A1* | 6/2002 | Manfredi | B08B 1/04 15/77 |
| 2005/0067104 A1* | 3/2005 | Takahara | B08B 1/04 156/345.54 |
| 2005/0183754 A1* | 8/2005 | Kago | H01L 21/67046 134/56 R |
| 2006/0270322 A1* | 11/2006 | Yilmaz | B24B 53/017 451/8 |
| 2007/0034232 A1* | 2/2007 | Diotte | B08B 1/04 134/6 |
| 2008/0011325 A1* | 1/2008 | Olgado | B08B 1/04 134/9 |
| 2008/0207095 A1* | 8/2008 | Goto | B08B 1/04 451/177 |
| 2010/0190417 A1* | 7/2010 | Watanabe | B24B 53/017 451/56 |
| 2013/0220368 A1 | 8/2013 | Ishibashi | |
| 2015/0140907 A1* | 5/2015 | Watanabe | B24B 37/04 451/56 |

FOREIGN PATENT DOCUMENTS

| | | |
|---|---|---|
| JP | 2006-272549 A | 10/2006 |
| JP | 2013-175496 A | 9/2013 |
| JP | 2014-038983 A | 2/2014 |

* cited by examiner

SUBSTRATE CLEANING APPARATUS AND SUBSTRATE PROCESSING APPARATUS

CROSS REFERENCE TO RELATED APPLICATION

This document claims priority to Japanese Patent Application Number 2013-208020 filed Oct. 3, 2013, the entire contents of which are hereby incorporated by reference.

BACKGROUND

There has been known a substrate cleaning apparatus for cleaning a surface of a substrate, such as a wafer, by pressing a cylindrical roll cleaning member against the substrate. This type of substrate cleaning apparatus is provided with a roll arm that rotatably supports the roll cleaning member. This roll arm is coupled to an elevating mechanism for moving the roll cleaning member closer to and away from the surface of the wafer. This elevating mechanism is disposed beside the roll arm because of an issue of a layout space. The elevating mechanism includes a horizontally-extending support arm, which supports the roll arm.

In this structure that supports the roll arm with the horizontally-extending support arm, a self-weight of the roll arm is applied to the support arm at all times. As a result, wear and permanent strain (or creep) may occur in components constituting the support arm, possibly causing a change in height of the roll cleaning member, supported by the roll arm, from an initial set position.

Thus, a height-adjustment mechanism for adjusting the height of the roll cleaning member is installed on the roll arm. FIG. 10 is schematic cross-sectional view of a conventional height-adjustment mechanism. As shown in FIG. 10, in this height-adjustment mechanism, two wedges 180, 181, each having a cross section of an approximately right-angled triangle shape, are overlapped one above the other such that their inclined surfaces contact each other. A height of a roll cleaning member 146 can be adjusted by regulating an amount of overlapping of these wedges 180, 181. In this height-adjustment mechanism, an adjustment screw 183 for regulating the amount of overlapping of the wedges 180, 181 is mounted to the lower wedge 181. The adjustment screw 183 is rotatably supported by a screw support 184 that is fixed to the roll arm 185. This screw support 184 allows the adjustment screw 183 to rotate about its own axis, while preventing the adjustment screw 183 from moving in a horizontal direction.

When the roll cleaning member 146 is to be elevated, the adjustment screw 183 is rotated in a clockwise direction to move the lower wedge 181 to a right side in the drawing, so that a relative distance between the upper wedge 180 and the lower wedge 181 is decreased. On the other hand, when the roll cleaning member 146 is to be lowered, the adjustment screw 183 is rotated in a counterclockwise direction to move the lower wedge 181 to a left side in the drawing, so that the relative distance between the upper wedge 180 and the lower wedge 181 is increased.

The height-adjustment mechanism having the above structures is provided on the roll arm, and is located right above a center of the roll cleaning member. This location is an optimal location for measuring a pressing load (i.e., a load at which the roll cleaning member presses the substrate). However, it is difficult to install a load-measuring device, such as a load cell, at this optimal location, because there exists the height-adjustment mechanism.

Furthermore, an amount of adjustment of the height-adjustment mechanism shown in this drawing is approximately plus and minus 1 mm, which is insufficient to adjust the height of the roll cleaning member 146. In order to increase the amount of adjustment, it is necessary either to increase an angle of the inclined surfaces of the wedges 180, 181 with respect to the horizontal direction, or to enlarge a size of the wedges 180, 181. However, in the case of increasing the angle of the inclined surfaces, a greater power is required for sliding the wedges 180, 181 in the horizontal direction. Therefore, it is difficult to conduct such a design change. Increasing the size of wedges 180, 181 entails a larger installation space.

Furthermore, in the conventional height-adjustment mechanism, the adjustment screw 183 for sliding the wedges 180, 181 protrudes horizontally from the roll arm 185. In such a construction, a processing liquid, such as a chemical liquid, rinsing liquid, or the like, which is used for cleaning the substrate, may adhere to the adjustment screw 183. In such a case, the attached processing liquid may drop onto the surface of the substrate, possibly causing a back contamination of the substrate. The chemical liquid or the rinsing liquid is typically supplied onto the substrate from obliquely above the substrate with use of a chemical liquid nozzle or a rinsing liquid nozzle disposed beside the roll arm 185. However, since the adjustment screw 183 protrudes from the roll arm 185 in the horizontal direction, the chemical liquid nozzle or the rinsing liquid nozzle must be disposed so as to avoid the adjustment screw 183. Such an arrangement of the adjustment screw 183 limits a layout, such as a location or an angle, of the chemical liquid nozzle and the rinsing liquid nozzle, thus inhibiting a free layout design.

SUMMARY OF THE INVENTION

According to an embodiment, there is provided a substrate cleaning apparatus for reducing a limitation of a layout of a chemical liquid nozzle and a rinsing liquid nozzle, while enabling a load cell to be installed at an optimal location and achieving a larger adjustment range. Furthermore, according to an embodiment, there is provided a substrate processing apparatus incorporating the substrate cleaning apparatus.

Embodiments, which will be described below, relate to a substrate cleaning apparatus for scrub-cleaning a surface of a substrate, such as a semiconductor wafer, with a roll cleaning member, which is in a column shape and extends horizontally, by rotating both the substrate and the roll cleaning member while placing the roll cleaning member in contact with the surface of the substrate, and further relate to a substrate processing apparatus incorporating such a substrate cleaning apparatus.

In an embodiment, there is provided a substrate cleaning apparatus, comprising: a roll assembly including at least a roll cleaning member to be brought into contact with a substrate and a roll arm that rotatably supports the roll cleaning member; a support arm for supporting the roll assembly; an adjustment screw extending through the support arm and screwed into the roll assembly; and a screw support that fixes a relative position of the adjustment screw in a vertical direction with respect to the support arm and rotatably supports the adjustment screw.

In an embodiment, the roll assembly further includes a tilting mechanism that allows the roll cleaning member to tilt, and the adjustment screw is screwed into the tilting mechanism.

In an embodiment, the substrate cleaning apparatus further comprises a biasing device configured to bias the roll assembly toward the support arm.

In an embodiment, the substrate cleaning apparatus further comprises a fixing device for fixing a rotational position of the adjustment screw.

In an embodiment, the substrate cleaning apparatus further comprises a waterproof cover that covers a portion of the adjustment screw protruding from the support arm.

In an embodiment, there is provided a substrate processing apparatus, comprising: a polishing unit configured to polish a substrate; and the substrate cleaning apparatus configured to clean the polished substrate.

According to the above-described embodiments, the adjustment screw can displace a relative position of the roll cleaning member in the vertical direction with respect to the support arm. Since the adjustment screw extends in the vertical direction, it is not necessary to provide wedges that are needed in the conventional height-adjustment mechanism. As a result, a space for installing a load measuring device, such as the load cell, can be provided over the roll arm. In particular, the load cell can be mounted to a center of the support arm which is the optimal location for measuring a pressing load of the roll cleaning member.

Furthermore, unlike the conventional height-adjustment mechanism using the wedges, increasing a length of the adjustment screw can increase a maximum amount of height adjustment of the roll cleaning member. Furthermore, since the adjustment screw does not protrude in the horizontal direction of the roll arm, a layout, such as a location and an angle, of a chemical liquid nozzle and a rinsing liquid nozzle is not affected, thus reducing a limitation of the layout of the chemical liquid nozzle and the rinsing liquid nozzle.

DESCRIPTION OF EMBODIMENTS

Figure 1:
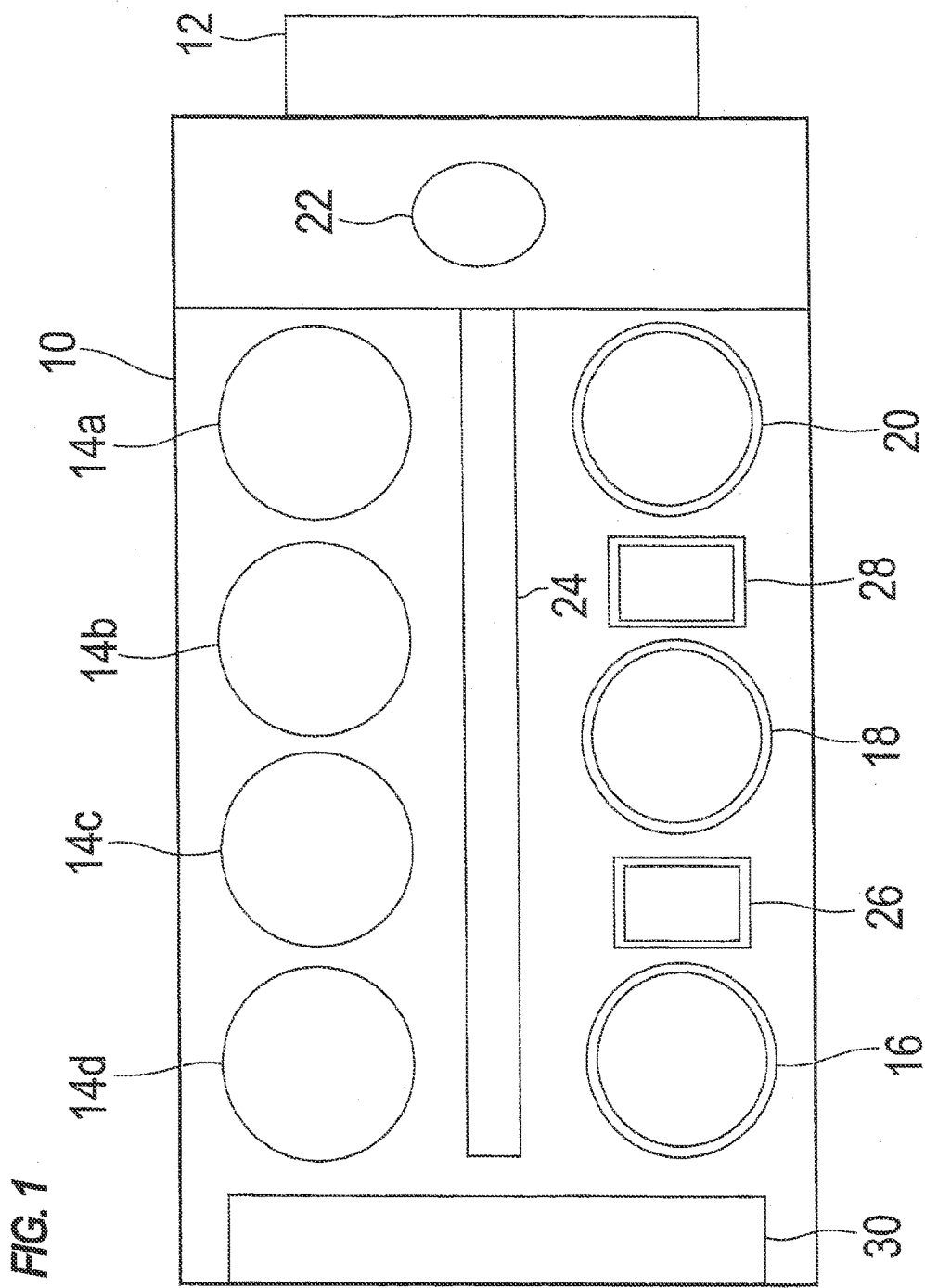
FIG. 1 is a schematic plan view showing an entire structure of a substrate processing apparatus incorporating therein a substrate cleaning apparatus according to an embodiment.

Embodiments of the present invention will now be described with reference to the drawings. The same reference numerals are used in the following embodiments to refer to the same or corresponding elements, and duplicate descriptions thereof are omitted.

FIG. 1 is a plan view showing an entire structure of a substrate processing apparatus incorporating a substrate cleaning apparatus according to an embodiment. As shown in FIG. 1, the substrate processing apparatus includes an approximately-rectangular housing 10, and a loading port 12 on which a substrate cassette, storing therein a large number of substrates, e.g., semiconductor wafers, is placed. The loading port 12 is disposed next to the housing 10 and is capable of receiving thereon an open cassette, a SMIF (Standard Manufacturing Interface) pod, or a FOUP (Front Opening Unified Pod). Each of the SMIF and the FOUP is a hermetically sealed container that houses therein a substrate cassette and is covered with a partition wall, and thus can keep independent internal environment isolated from an external space.

In the housing 10, there are provided a plurality of (four in this embodiment) polishing units 14a to 14d, a first substrate cleaning unit 16 and a second substrate cleaning unit 18 each for cleaning a substrate after polishing, and a substrate drying unit 20 for drying a substrate after cleaning. The polishing units 14a to 14d are arranged along a longitudinal direction of the substrate processing apparatus, and the substrate cleaning units 16, 18 and the substrate drying unit 20 are also arranged along the longitudinal direction of the substrate processing apparatus. The substrate cleaning apparatus according to the embodiment is applied to the first substrate cleaning unit 16 and/or the second substrate cleaning unit 18.

A first substrate transfer robot 22 is disposed in an area surrounded by the loading port 12, the polishing unit 14a, and the substrate drying unit 20. A substrate transport unit 24 is disposed in parallel to the polishing units 14a to 14d. The first substrate transfer robot 22 receives a substrate to be polished from the loading port 12 and transfers the substrate to the substrate transport unit 24, and receives a dried substrate from the substrate drying unit 20 and returns the substrate to the loading port 12. The substrate transport unit 24 is configured to transport a substrate that has been received from the first substrate transfer robot 22 and transfer the substrate to and from the polishing units 14a-14d.

A second substrate transfer robot 26 is located between the first substrate cleaning unit 16 and the second substrate cleaning unit 18. This second substrate transfer robot 26 is provided for transporting a substrate between the first substrate cleaning unit 16 and the second substrate cleaning unit 18. A third substrate transfer robot 28 is located between the second substrate cleaning unit 18 and the substrate drying unit 20. This third substrate transfer robot 28 is provided for transporting a substrate between the second substrate cleaning unit 18 and the substrate drying unit 20. In the housing 10, there is provided a control panel (or an operation panel) 30 through which set values, e.g., a set pressing load of a roll cleaning member, are inputted. This control panel 30 also serves as an operation controller that controls operations of the polishing units 14a-14d, the first substrate transfer robot 22, the first substrate cleaning unit 16, the second substrate cleaning unit 18, the substrate drying unit 20, the second substrate transfer robot 26, and the third substrate transfer robot 28.

The substrate processing apparatus having the above-described construction is configured to remove a substrate from the substrate cassette in the loading port 12 and transport the substrate to one of the polishing units 14a-14d, and then polish the substrate. The polished substrate is cleaned in the first substrate cleaning unit 16 (primary cleaning), and is further cleaned in the second substrate cleaning unit 18 (finish cleaning). The cleaned substrate is removed from the second substrate cleaning unit 18, and is transported to the substrate drying unit 20 where the substrate is dried. The dried substrate is then returned to the substrate cassette in the loading port 12.

Figure 2:
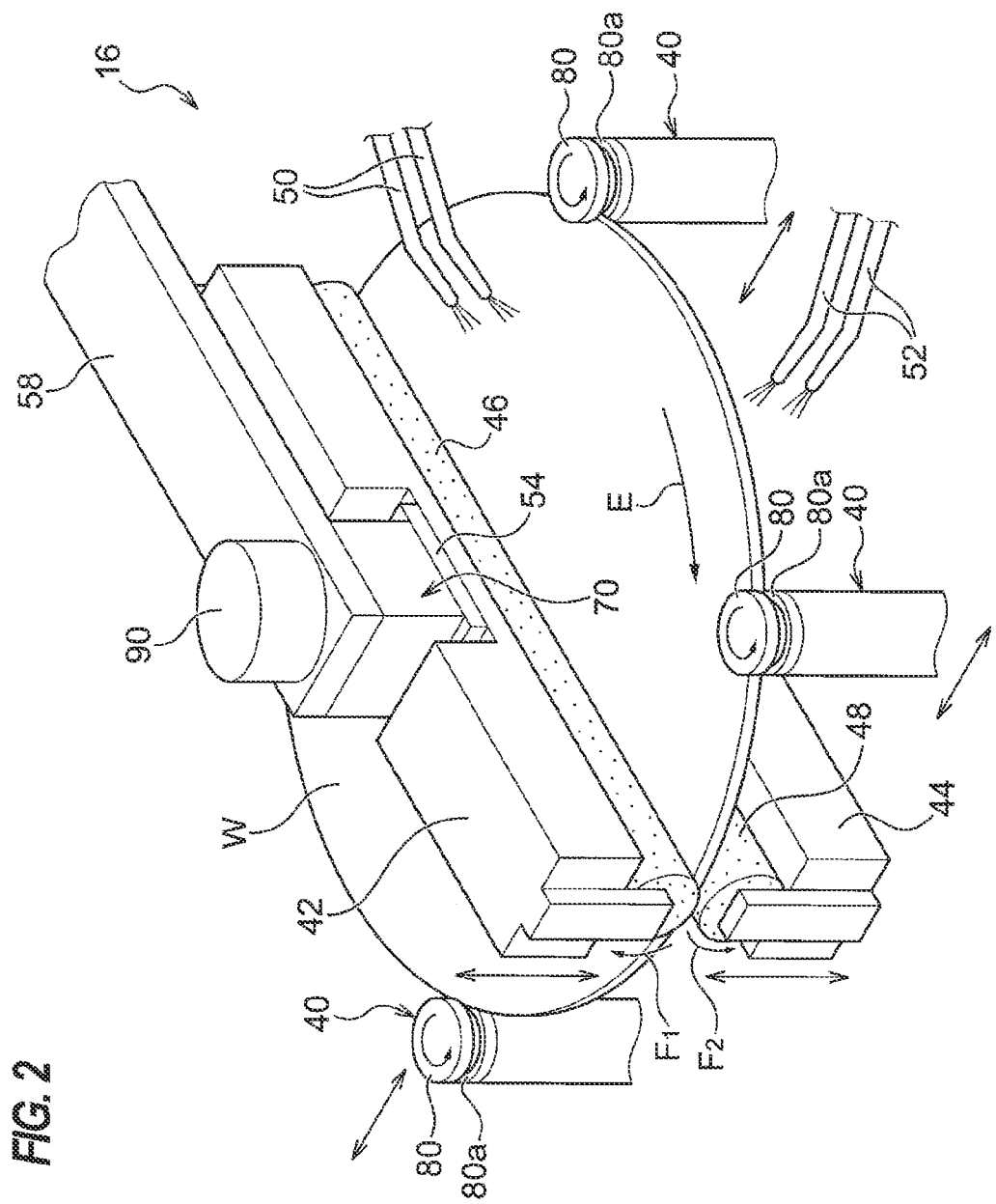
FIG. 2 is a schematic perspective view showing the substrate cleaning apparatus, according to an embodiment, incorporated in the substrate processing apparatus shown in FIG. 1.
Figure 3:
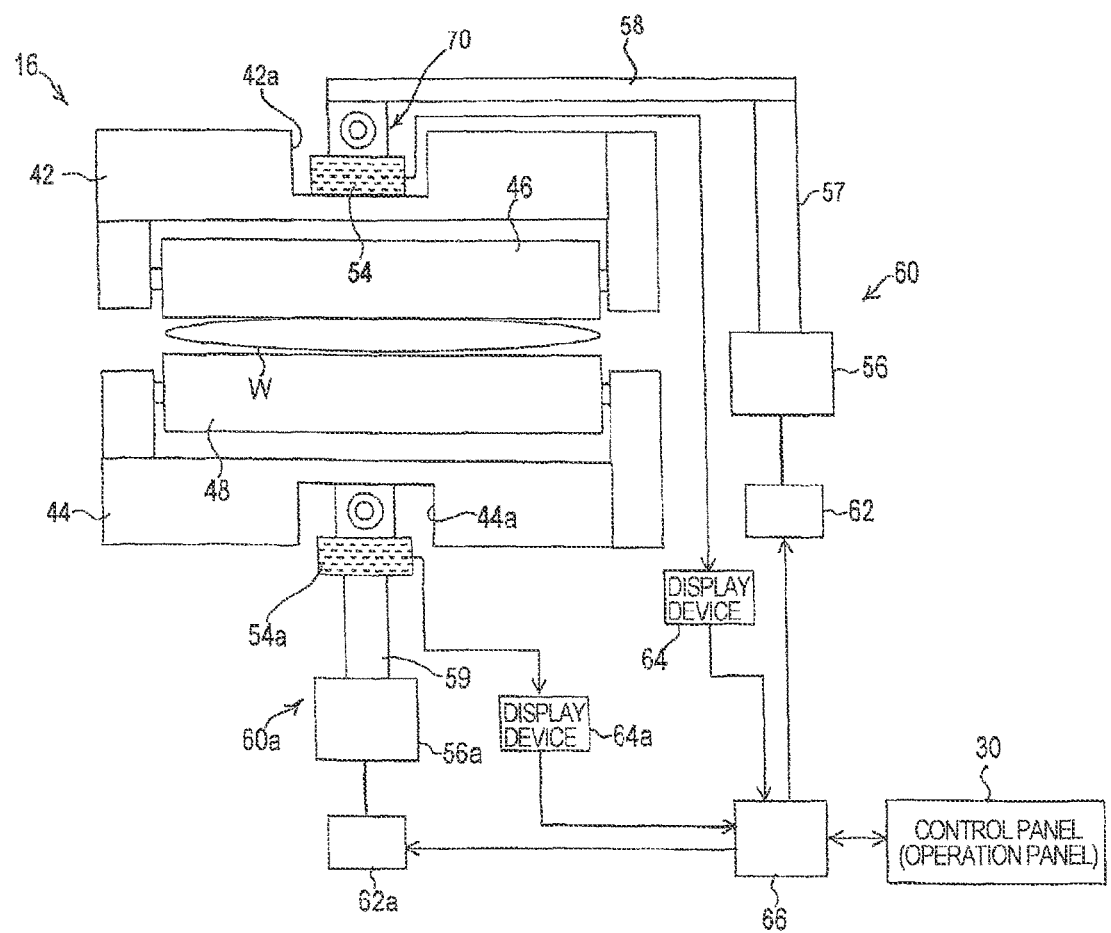
FIG. 3 is a schematic front view showing an entire structure of the substrate cleaning apparatus according to the embodiment.

FIG. 2 is a schematic perspective view showing the substrate cleaning unit 16, according to an embodiment, incorporated in the substrate processing apparatus shown in FIG. 1. FIG. 3 is a schematic front view showing an entire structure of the substrate cleaning unit 16 according to the embodiment.

As shown in FIG. 2, the substrate cleaning unit 16 includes a plurality of (four in the drawing) spindles 40 for supporting a peripheral portion of a substrate W, such as a semiconductor wafer, with its front surface facing upwardly, and horizontally rotating the substrate W. These spindles 40 are movable in the horizontal direction as indicated by arrow shown in FIG. 2. The substrate cleaning unit 16 further includes an upper roll arm 42 that is vertically movable and disposed above the substrate W, and a lower roll arm 44 that is vertically movable and disposed below the substrate W.

Each spindle 40 has a roller 80 provided on a top thereof. An engagement groove 80a is formed in a circumferential side surface of the roller 80. The rollers 80 are rotated while pressing the substrate W with the peripheral portion of the substrate W lying in the engagement grooves 80a, thereby rotating the substrate W horizontally as indicated by arrow E shown in FIG. 2. According to the embodiment shown in this drawing, all of the four rollers 80 are coupled to a drive mechanism (not shown) to apply a rotational force to the substrate W. Two of the four rollers 80 may apply a rotational force to the substrate W (a drive mechanism is not shown in the drawing), while the other two rollers 80 may function as bearings that receive the rotation of the substrate W.

An upper roll cleaning member (a roll sponge) 46, which is in a column shape and extends horizontally, is rotatably supported by the upper roll arm 42. The upper roll cleaning member 46 is made of PVA (polyvinyl alcohol), for example, and is rotated by a driving mechanism (not shown) in a direction indicated by arrow $F_1$ in FIG. 2. A lower roll cleaning member (a roll sponge) 48, which is in a column shape and extends horizontally, is rotatably supported by the lower roll arm 44. The lower roll cleaning member 48 is made of PVA, for example, and is rotated by a driving mechanism (not shown) in a direction indicated by arrow $F_2$ in FIG. 2.

Two upper supply nozzles 50 for supplying a chemical liquid and pure water (or a rinsing liquid) onto a front surface (an upper surface) of the substrate W are disposed above the substrate W that is supported and rotated by the spindles 40. One of the two upper supply nozzles 50 supplies the chemical liquid, and the other supplies the pure water. Two lower supply nozzles 52 for supplying a chemical liquid and pure water (or a rinsing liquid) onto a back surface (a lower surface) of the substrate W are disposed below the substrate W that is supported and rotated by the spindles 40. One of the two lower supply nozzles 52 supplies the chemical liquid, and the other supplies the pure water.

Cleaning of the substrate W is performed as follows. While the substrate W is rotated horizontally, the chemical liquid is supplied from the upper supply nozzle 50 onto the front surface (upper surface) of the substrate W. While the upper roll cleaning member 46 is rotated, the upper roll cleaning member 46 is lowered to contact the front surface of the rotating substrate W at a predetermined pressing load. The front surface of the substrate W is scrub-cleaned with the upper roll cleaning member 46 in the presence of the chemical liquid. A length of the upper roll cleaning member 46 is set to be slightly larger than a diameter of the substrate W, so that the front surface of the substrate W in its entirety is simultaneously cleaned.

At the same time that the front surface of the substrate W is cleaned, the chemical liquid is supplied from the lower supply nozzle 52 onto the back surface (lower surface) of the substrate W, while the lower roll cleaning member 48 is rotated and elevated to contact the back surface of the rotating substrate W at a predetermined pressing load. The back surface of the substrate W is scrub-cleaned with the lower roll cleaning member 48 in the presence of the chemical liquid. A length of the lower roll cleaning member 48 is set to be slightly larger than the diameter of the substrate W, so that the back surface of the substrate W in its entirety is simultaneously cleaned. After the front surface and the back surface of the substrate W are cleaned, the pure water is supplied from the upper supply nozzle 50 and the lower supply nozzle 52 onto the front surface and the back surface of the substrate W, thereby rinsing the substrate W.

As shown in FIG. 3, a recess 42a is formed in a center of the upper roll arm 42. A load cell 54, located in this recess 42a, is secured to the upper roll arm 42. The upper roll arm 42 is coupled to an elevating mechanism 60. This elevating mechanism 60 includes an air cylinder 56 as an actuator, a vertically-movable shaft 57 which is elevated and lowered by the air cylinder (actuator) 56 and extends in a vertical direction, and a support arm 58 which is coupled to an upper end of this vertically-movable shaft 57 and extends in the horizontal direction. The upper roll arm 42 is coupled to a free end of this support arm 58 through an adjustment screw 83, which will be described later.

The upper roll arm 42 is elevated and lowered by the air cylinder 56 together with the vertically-movable shaft 57 and the support arm 58. An electropneumatic regulator 62, serving as a pressure regulator that regulates a pressure of a gas supplied into the air cylinder 56, is coupled to the air cylinder 56.

When the substrate W is to be cleaned, the upper roll arm 42 is lowered until the upper roll cleaning member 46 is brought into contact with the substrate W. At this time, a tensile load applied to the load cell 54 decreases. This amount of decrease in the tensile load substantially corresponds to a pressing load applied from the upper roll cleaning member 46 to the substrate W. The pressing load applied from the upper roll cleaning member 46 to the substrate W, i.e., the amount of decrease in the tensile load, is measured by the load cell 54. The electropneumatic regulator 62 can regulate the pressing load based on the measured pressing load.

A measured value of the pressing load obtained by the load cell 54 is sent through a display device 64 to a load controller 66, and a control signal is sent from the load controller 66 to the electropneumatic regulator 62. With these configurations, a closed-loop control system is constructed. A set value of the pressing load is inputted through the control panel (or the operation panel) 30 into the load controller 66.

The load controller 66 is configured to compare the measured value of the pressing load with the set value of the pressing load, generate a control signal indicating a manipulated variable for the electropneumatic regulator 62 to minimize a difference between the measured value and the set value of the pressing load, and transmit this control signal to the electropneumatic regulator 62. The electropneumatic regulator 62 operates based on the control signal to change a thrust force of the air cylinder 56, thereby changing the pressing load applied to the substrate W during cleaning of the substrate W.

Figure 4:
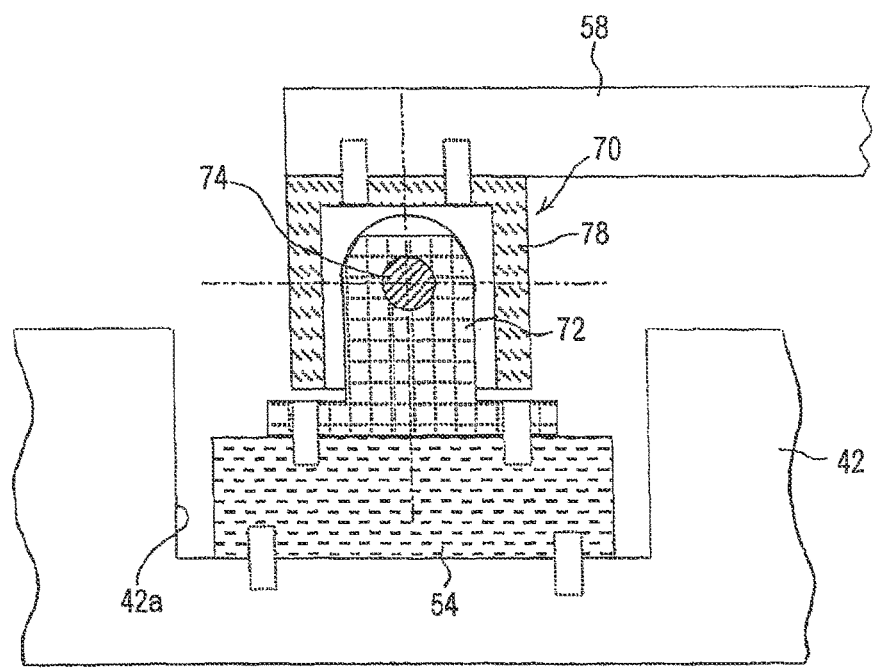
FIG. 4 is a schematic vertical cross-sectional front view of a tilting mechanism.
Figure 4:
Figure 5:
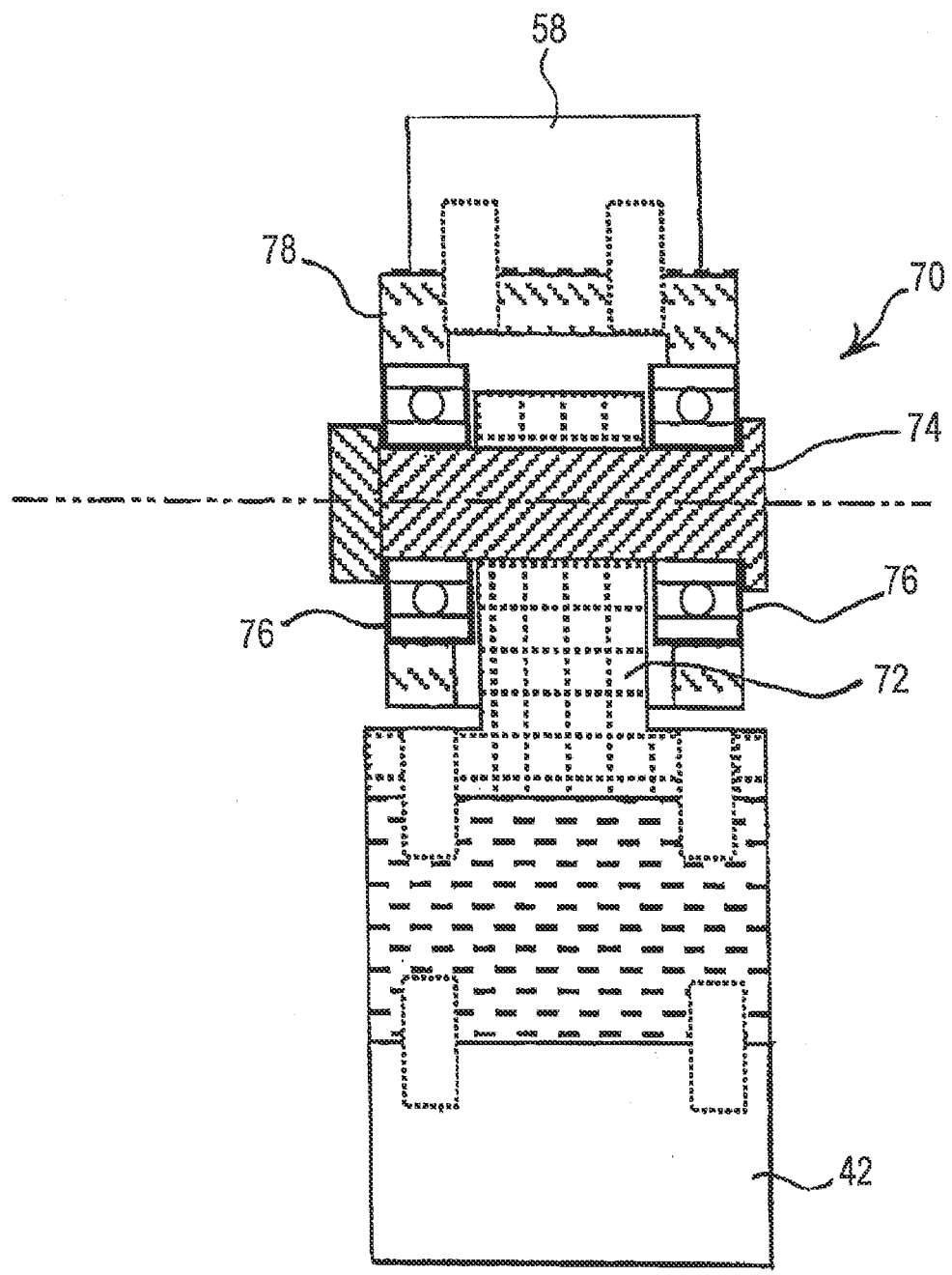
FIG. 5 is a schematic vertical cross-sectional side view of the tilting mechanism.

A tilting mechanism 70 that tiltably supports the upper roll arm 42 is installed between the load cell 54 and the free end of the support arm 58. As shown in FIG. 4 and FIG. 5, this tilting mechanism 70 includes a bracket 72 secured to the load cell 54, a bearing casing 78 coupled to the support arm 58, and a pivot shaft 74 that rotatably couples the bracket 72 to the bearing casing 78. The bracket 72 has a through-hole extending horizontally in a direction orthogonal to an extending direction of the upper roll arm 42. The pivot shaft 74 is disposed in this through-hole, and is fixed to the bracket 72. The bearing casing 78, to which a pair of bearings 76 rotatably supporting the pivot shaft 74 are mounted, is coupled to the free end of the support arm 58 through the adjustment screw 83 which will be described later. With these configurations, the tilting mechanism 70 that allows the upper roll arm 42, to which the load cell 54 is fixed, to tilt around the pivot shaft 74 in an $Y_1$ direction indicated in FIG. 4, is constructed.

The support arm 58 tiltably supports, through the tilting mechanism 70, the upper roll cleaning member 46 rotatably supported by the upper roll arm 42. With this structure, the upper roll cleaning member 46, while keeping its horizontal attitude, can follow a movement of the surface of the substrate W when a warp, an inclination, a fluttering due to the rotation, or the like, of the substrate W occurs. Therefore, the upper roll cleaning member 46 in its entire length can uniformly contact the substrate W. Since the pressing load is uniformly applied to the substrate W in this manner, a substrate cleaning performance can be enhanced. In addition, a measurement accuracy of the pressing load can be enhanced, because the upper roll cleaning member 46 in its entirety receives a repulsive force from the substrate W.

Figure 6:
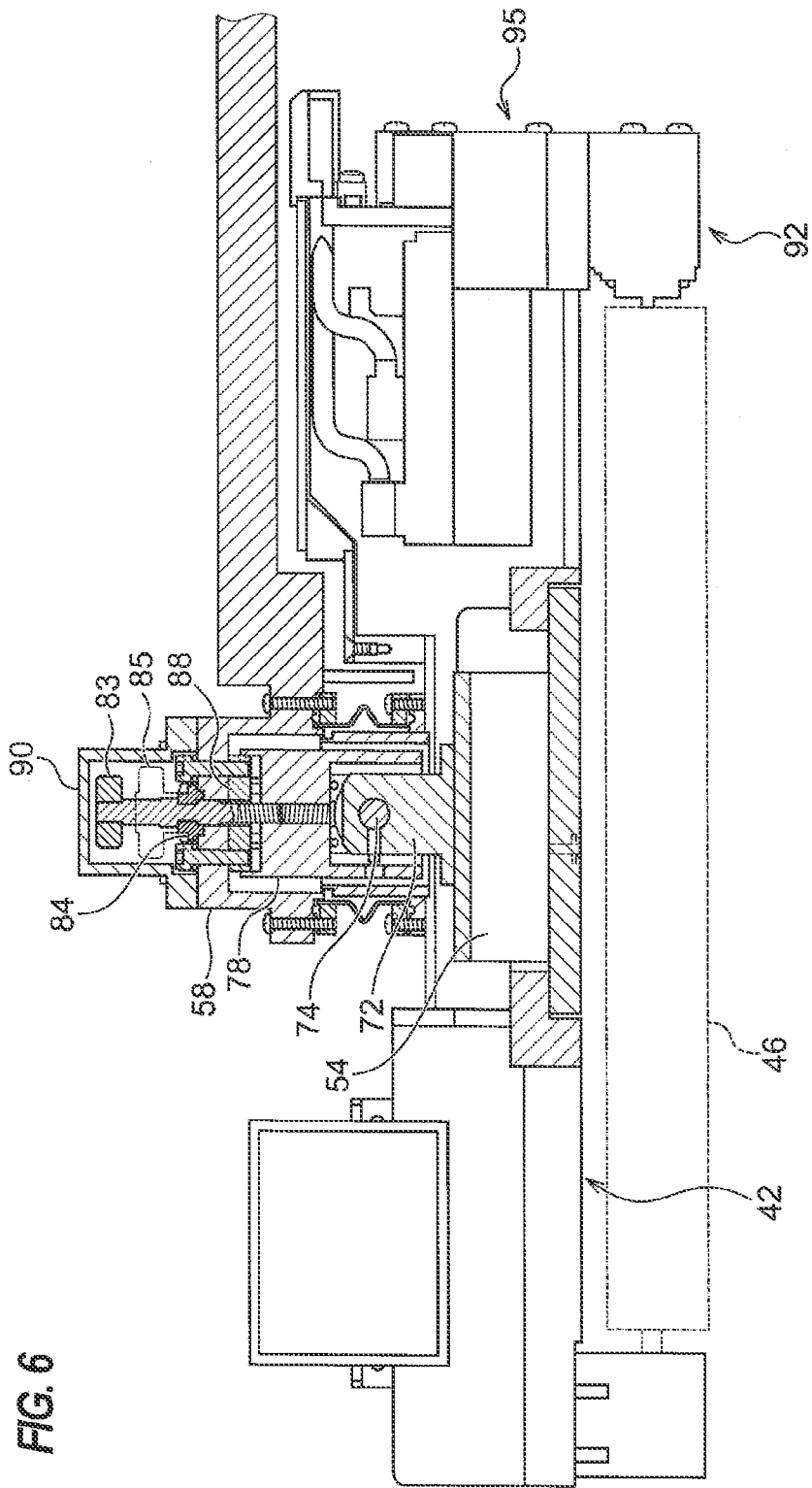
FIG. 6 is a schematic vertical cross-sectional view showing the substrate cleaning apparatus according to the embodiment.
Figure 7:
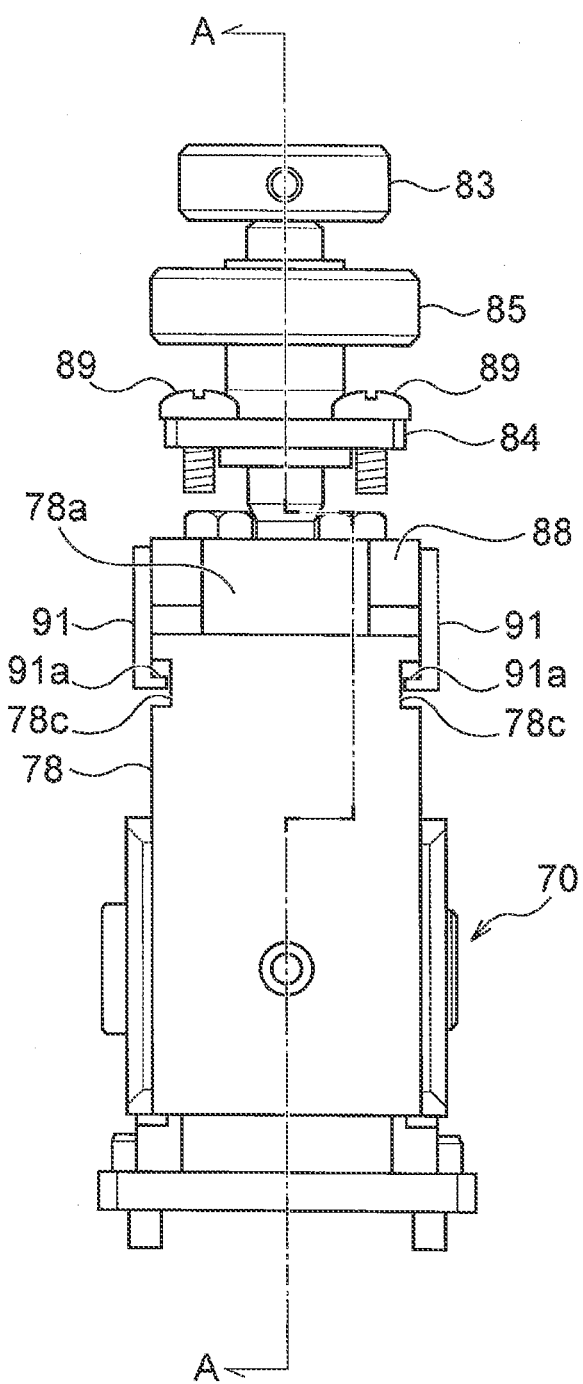
FIG. 7 is an enlarged view showing an adjustment screw and the tilting mechanism of the substrate cleaning apparatus shown in FIG. 6.
Figure 8:
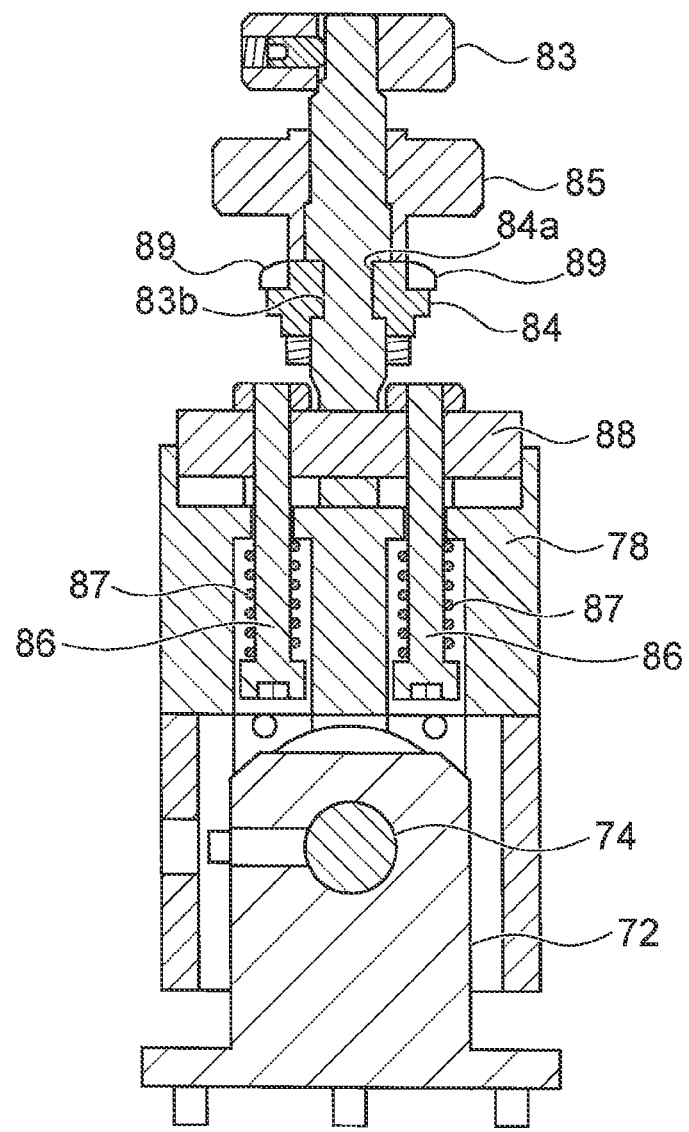
FIG. 8 is a cross-sectional view taken along line A-A of FIG. 7.
Figure 9:
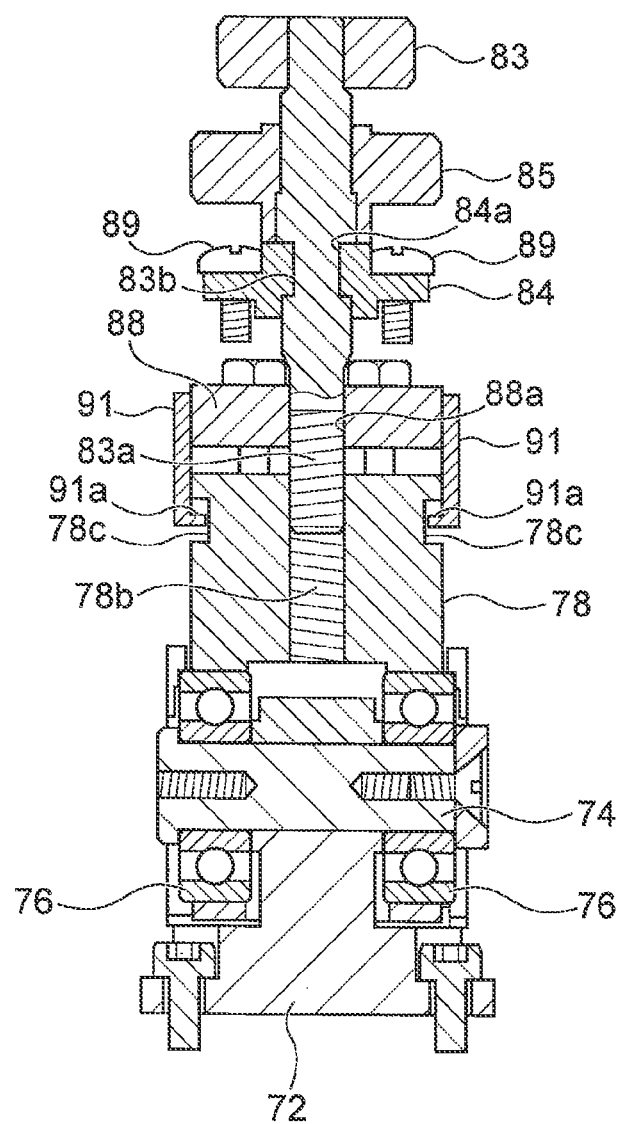
FIG. 9 is a vertical cross-sectional view of FIG. 7.
Figure 10:
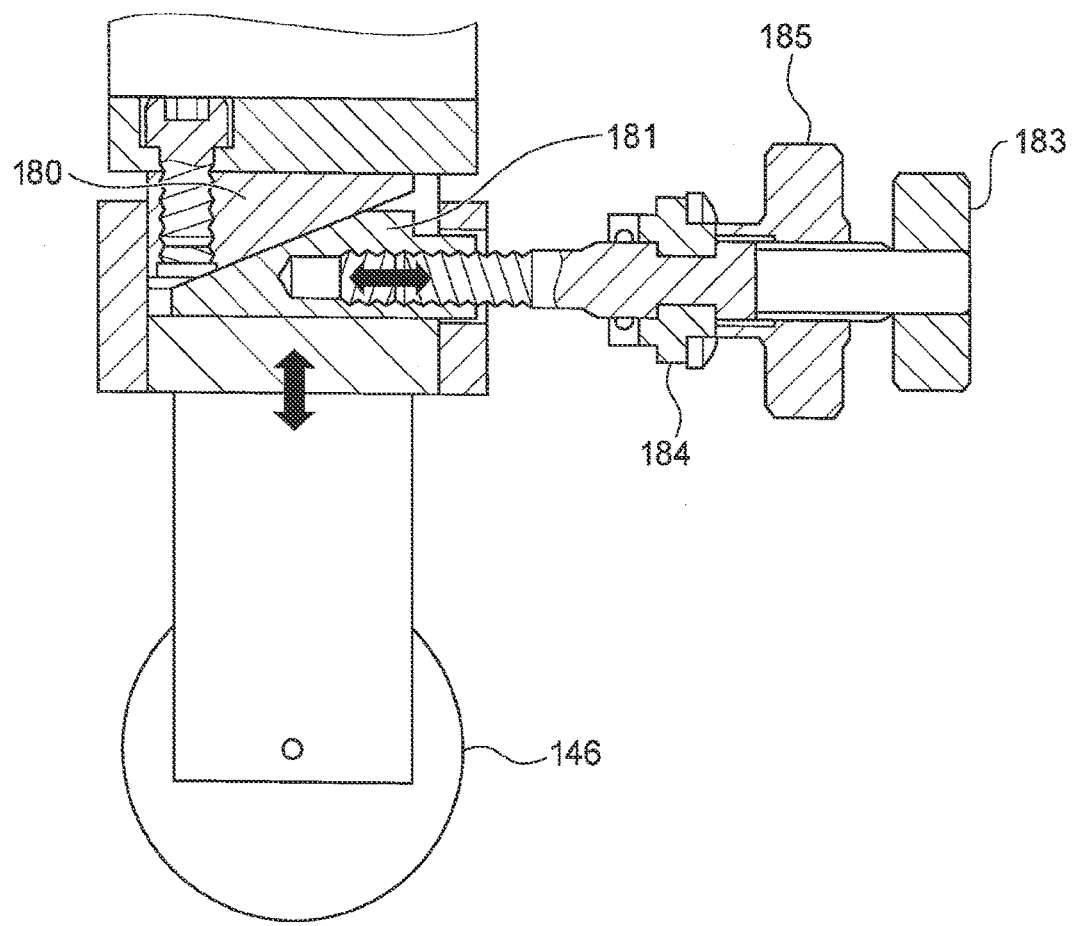
FIG. 10 is a schematic cross-sectional view of a conventional height-adjustment mechanism.

FIG. 6 is a schematic vertical cross-sectional view showing the substrate cleaning apparatus according to the embodiment, and FIG. 7 is an enlarged view showing the adjustment screw and the tilting mechanism of the substrate cleaning apparatus shown in FIG. 6. FIG. 8 is a cross-sectional view taken along line A-A of FIG. 7, and FIG. 9 is a vertical cross-sectional view of FIG. 7. As shown in FIG. 6, the roll cleaning member 46 is rotatably supported by the upper roll arm 42. A motor 92 for rotating the roll cleaning member 46 is coupled to an end of a rotational shaft of the roll cleaning member 46. As described above, the load cell 54 is secured to the center of the upper roll arm 42, and the bracket 72 of the tilting mechanism 70 is secured to the load cell 54. The pivot shaft 74, which is secured to the bracket 72, is rotatably supported by the bearings 76, and the bearings 76 are secured to the bearing casing 78. This bearing casing 78 is coupled to the free end of the support arm 58 by the adjustment screw 83.

The adjustment screw 83 extends through the support arm 58 in the vertical direction, and is screwed into the bearing casing 78 of the tilting mechanism 70. As shown in FIG. 9, a through-hole 88a, extending in the vertical direction, is formed in a center of a top guide 88 that is fixed to the support arm 58. The adjustment screw 83 is inserted into the through-hole 88a. The bearing casing 78 also has a through-hole formed therein, and a female screw 78b is formed in this through-hole. A male screw portion 83a of the adjustment screw 83 is screwed into and engaged with the female screw 78b, so that the bearing casing 78 is coupled to the support arm 58 through the adjustment screw 83.

The adjustment screw 83 is rotatably supported by a screw support 84 (see FIG. 6) which is fixed to the support arm 58. As shown in FIG. 8 and FIG. 9, this screw support 84 has an annular protrusion 84a, which is loosely fitted into an annular recess 83b formed in a shaft portion of the adjustment screw 83. The screw support 84 is fixed to the support arm 58 by screws 89. The screw support 84 allows the adjustment screw 83 to rotate about its own axis, while fixing a position of the adjustment screw 83 in the vertical direction. A nut 85, serving as a fixing device for fixing a rotational position of the adjustment screw 83, is provided on the adjustment screw 83. By tightening this nut 85, the rotational position of the adjustment screw 83 is fixed.

Backup guides 91 are fixed to outer surfaces (both side surfaces as viewed in FIG. 7 and FIG. 9) of the top guide 88 that is fixed to the support arm 58. These backup guides 91 serve as a displacement restriction member for restricting displacement, in the vertical direction, of the bearing casing 78 and the upper roll arm 42 coupled to the bearing casing 78. Protrusions 91a protruding inwardly are formed respectively on lower ends of the backup guides 91. These protrusions 91a are located in recesses 78c which are formed in the outer surfaces of the bearing casing 78. Each recess 78c has a predetermined length in the vertical direction. A position at which the protrusions 91a of the backup guides 91 contact upper end surfaces of the recesses 78c is a lower limit of a position of the roll arm 42 in the vertical direction, and a position at which the protrusions 91a of the backup guides 91 contact lower end surfaces of the recesses 78c is an upper limit of a position of the roll arm 42 in the vertical direction. In the embodiment shown in the drawings, a range of height adjustment of the roll arm 42 (i.e., a distance from the upper limit to the lower limit) is set to be plus and minus 2 mm, i.e., 4 mm.

With this structure, when the roll arm 42 is to be elevated, the nut 85 is firstly loosened. Then, the adjustment screw 83 is rotated in a direction (clockwise direction) to screw the adjustment screw 83 into the bearing casing 78 of the tilting mechanism 70, thereby decreasing a relative distance between the bearing casing 78 and the support arm 58. As a result, the upper roll arm 42 that is fixed to the bearing casing 78 through the bracket 72 and the load cell 54 is raised. As shown in FIG. 7, extension portions 78a extending upwardly in the vertical direction are formed on both side surfaces of the bearing casing 78. These extension portions 78a are in surface contact with outer surfaces of the top guide 88, respectively. The backup guides 91 are also in surface contact with outer surfaces of the bearing casing 78, respectively. These two surface contacts restrict a rotation of the roll arm 42 in the horizontal direction when the adjustment screw 83 is screwed into the bearing casing 78, so that the roll arm 42 is elevated in accordance with an amount of rotation of the adjustment screw 83.

When the roll arm 42 is to be lowered, the nut 85 is loosened, and then the adjustment screw 83 is rotated in a direction (counterclockwise direction) to pull the adjustment screw 83 from the bearing casing 78, thereby increasing the relative distance between the bearing casing 78 of the tilting mechanism 70 and the support arm 58. As a result, the roll arm 42 that is fixed to the bearing casing 78 through the bracket 72 and the load cell 54 is lowered. After the adjustment of position of the roll arm 42 in the vertical direction is terminated, the nut 85 is tightened to fix the rotational position of the adjustment screw 83. In this manner, a series of the position adjustment is completed.

Such height adjustment of the roll arm 42 is performed at a start-up of the apparatus or at a time of maintenance.

In this manner, according to the embodiment, the position (i.e., the height) of the roll arm 42 in the vertical direction can be adjusted only by rotating the adjustment screw 83 that is screwed into the support arm 58 from above the support arm 58. In order not to prevent the vertical movement of the roll arm 42, a lubricant, such as grease, may preferably be applied between the male screw portion 83a of the adjustment screw 83 and the female screw 78b of the bearing casing 78 into which the male screw portion 83a is screwed. Furthermore, a lubricant, such as grease, may preferably be applied between the extension portions 78a and the outer surfaces of the top guide 88, and between the backup guides 91 and the outer surfaces of the bearing casing 78. Furthermore, geometric tolerances of a flatness and a parallelism between the outer surfaces of the top guide 88 and the extension portions 78a of the bearing casing 78, as well as a flatness and a parallelism between the backup guides 91 and the bearing casing 78, may preferably be controlled strictly so as to ensure appropriate surface contact.

Although not shown in the drawing, in a case where the tilting mechanism 70 is not provided, the upper roll arm 42 may be provided with a female screw, and the adjustment screw 83 may be directly screwed into the upper roll arm 42. In this case also, the adjustment screw 83 is screwed into the upper roll arm 42 from right above the support arm 58 to adjust the position of the upper roll arm 42 in the vertical direction.

According to the substrate cleaning apparatus having such constructions, the adjustment screw 83, which is screwed into the upper roll arm 42 from above the support arm 58, can displace the relative position of the upper roll arm 42 with respect to the support arm 58 in the vertical direction. Since the adjustment screw 83 is disposed outside the upper roll arm 42, the load cell 54 can be installed at the optimal location that is in the center of the roll cleaning member 46.

The maximum amount of adjustment of the height of the upper roll arm 42 is determined by a length of the male screw portion 83a of the adjustment screw 83 and a vertical length of the recesses 78c of the bearing casing 78 in which the protrusions 91a of the backup guides 91 are located. Therefore, by increasing the length of the male screw portion 83a and the length of the recesses 78c, the maximum amount of adjustment can be greatly increased as compared with a conventional height-adjustment mechanism. The adjustable range of the height of the upper roll arm 42 in the embodiment shown in the drawings is plus and minus 2 mm. However, the maximum adjustable range of the roll arm 42 can be easily varied by changing the length of the male screw portion 83a of the adjustment screw 83 and the vertical length of the recesses 78c of the bearing casing 78. Moreover, since the adjustment screw 83 does not project from the roll arm 42 in the horizontal direction, a layout, such as a position and an angle, of the upper supply nozzles 50 is not affected. As a result, the limitation of layout design of the upper supply nozzles 50 is reduced.

A relative height (a position in the vertical direction) of the adjustment screw 83 with respect to the support arm 58 is fixed, while a relative height (a position in the vertical direction) of each of the upper roll arm 42, the roll cleaning member 46, and the tilting mechanism 70 with respect to the support arm 58 can be changed by operating the adjustment screw 83. In this specification, a plurality of elements, whose relative heights (or positions in the vertical direction) with respect to the support arm 58 can be changed by the operation of the adjustment screw 83, are collectively referred to as a roll assembly 95. This roll assembly 95 includes at least the roll arm 42 and the roll cleaning member 46.

As shown in FIG. 8, the top guide 88, fixed to the support arm 58, is coupled to the bearing casing 78 by a plurality of (e.g., four) bolts 86 and springs (biasing devices) 87 attached to the respective bolts 86. The bolts 86 are secured to the top guide 88. Each of the springs 87 is disposed around each of the bolts 86, and is supported by a head of each bolt 86. The bearing casing 78 is biased toward the support arm 58 by repulsive forces of the springs 87.

With this structure, backlash of the roll arm 42 fixed to the bearing casing 78 can be prevented, and therefore an altitude of the roll arm 42 is stabilized. It is preferable from a viewpoint of stability that the bolts 86 and the springs 87 be evenly arranged at a plurality of locations around the adjustment screw 83. Furthermore, it is possible to regulate the repulsive forces of the springs 87 by regulating depth of the bolts 86 screwed into the top guide 88.

As shown in FIG. 2 and FIG. 6, a waterproof cover 90 is provided so as to cover a portion of the adjustment screw 83 protruding upwardly from the support arm 58. This waterproof cover 90 prevents a processing liquid or the like from adhering to the adjustment screw 83. If the processing liquid is unlikely to adhere to the adjustment screw 83, the waterproof cover 90 may be omitted.

Although the embodiments have been described above, it should be understood that the present invention is not limited to the above embodiments, and various changes and modifications may be made without departing from the technical concept of the appended claims, the specification, and the drawings.

What is claimed is:

1. A substrate cleaning apparatus, comprising:
    a roll arm for rotatably supporting a roll cleaning member to be brought into contact with a substrate;
    a support arm supporting the roll arm;
    an adjustment screw vertically extending through the support arm and supporting the roll arm, the adjustment screw being rotatable to adjust a height of an entirety of the roll arm relative to the support arm;
    a screw support that fixes a relative position of the adjustment screw in a vertical direction with respect to the support arm and rotatably supports the adjustment screw;
    an actuator configured to move the roll arm, the adjustment screw, and the support arm together in the vertical direction; and
    a backup guide that restricts a rotation of the roll arm relative to the support arm when the adjustment screw rotates.

2. The substrate cleaning apparatus according to claim 1, further comprising:
    a tilting mechanism that allows the roll arm to tilt;
    the adjustment screw is screwed into the tilting mechanism.

3. The substrate cleaning apparatus according to claim 1, further comprising:
    a biasing device biasing the roll arm toward the support arm.

4. The substrate cleaning apparatus according to claim 1, further comprising:
    a fixing device for fixing a rotational position of the adjustment screw.

5. The substrate cleaning apparatus according to claim 1, further comprising:

a waterproof cover that covers a portion of the adjustment screw protruding from the support arm.

6. A substrate processing apparatus, comprising:

a polishing unit configured to polish a substrate; and a substrate cleaning apparatus configured to clean the polished substrate, the substrate cleaning apparatus comprising:

a roll arm for rotatably supporting a roll cleaning member to be brought into contact with the substrate;

a support arm supporting the roll arm;

an adjustment screw vertically extending through the support arm and supporting the roll arm, the adjustment screw being rotatable to adjust a height of an entirety of the roll arm relative to the support arm;

a screw support that fixes a relative position of the adjustment screw in a vertical direction with respect to the support arm and rotatably supports the adjustment screw;

an actuator configured to move the roll arm, the adjustment screw, and the support arm together in the vertical direction; and a backup guide that restricts a rotation of the roll arm relative to the support arm when the adjustment screw rotates.

7. The substrate cleaning apparatus according to claim 1, wherein the screw support is fixed to the support arm.

8. The substrate cleaning apparatus according to claim 1, wherein the roll arm is supported by a free end of the support arm through the adjustment screw.

9. The substrate cleaning apparatus according to claim 1, wherein the roll arm is located below the support arm.

10. The substrate cleaning apparatus according to claim 1, wherein the backup guide is located between the support arm and the roll arm.

11. The substrate cleaning apparatus according to claim 3, wherein the biasing device comprises a spring.

* * * * *